United States Patent [19]

Naik

[11] Patent Number: 4,885,216
[45] Date of Patent: * Dec. 5, 1989

[54] HIGH STRENGTH NICKEL BASE SINGLE CRYSTAL ALLOYS

[75] Inventor: Subhash K. Naik, Milford, Conn.

[73] Assignee: AVCO Corporation, Providence, R.I.

[*] Notice: The portion of the term of this patent subsequent to Jun. 30, 2004 has been disclaimed.

[21] Appl. No.: 247,920

[22] Filed: Sep. 22, 1988

Related U.S. Application Data

[63] Continuation-in-part of Ser. No. 34,755, Apr. 3, 1987, abandoned.

[51] Int. Cl.[4] .................. B32B 15/01; C22C 19/05
[52] U.S. Cl. .................. 428/680; 156/DIG. 100; 148/404
[58] Field of Search .................. 428/680, 678; 156/DIG. 100; 148/404

[56] References Cited

U.S. PATENT DOCUMENTS

| | | | |
|---|---|---|---|
| Re. 32,121 | 4/1986 | Gupta et al. | 428/656 |
| 4,402,772 | 9/1983 | Duhl et al. | 148/404 |
| 4,447,503 | 5/1984 | Dardi et al. | 428/656 X |
| 4,582,548 | 4/1986 | Harris et al. | 148/404 |
| 4,585,481 | 4/1986 | Gupta et al. | 428/656 X |
| 4,677,035 | 6/1987 | Fiedler et al. | 420/448 |
| 4,801,513 | 1/1989 | Duhl et al. | 148/404 |

OTHER PUBLICATIONS

Tsuya, et al. "Magnetostrictive Transducer", Chem. Abstr. 208183g, vol. 89 (1978).
Shankar, et al. "Nickel or Cobalt Single Crystal of Polycrystalline Alloy" Chem. Abstr. 84881k, vol. 95 (1981).
General Electric Co., "Nickel-Based Superalloys", Chem. Abstr. 38411p vol. 104 (1986).

Primary Examiner—Brian E. Hearn
Assistant Examiner—Andrew Griffis
Attorney, Agent, or Firm—Perman & Green

[57] ABSTRACT

Disclosed are novel nickel base single crystal alloy compositions consisting essentially of, by weight, about 8.0–14.0% chromium, 1.5–6.0% cobalt, 0.5–2.0% molybdenum, 3.0–10% tungsten, 2.5–7.0% titanium, 2.5–7.0% aluminum, 3.0–6.0% tantalum, about 0.005% to about 1.0% each of hafnium and/or silicon, optional minor amounts of yttrium, lanthanum and/or manganese, and the balance nickel.

Methods of thermal treatment and coating of the novel alloys to enhance their mechanical properties are also disclosed, as are articles produced by such methods.

18 Claims, 2 Drawing Sheets

FIG. 2.

HIGH STRENGTH NICKEL BASE SINGLE CRYSTAL ALLOYS

This is a continuation-in-part of Ser. No. 034,755, filed 4/3/87, now abandoned.

BACKGROUND OF THE INVENTION

1. Field of the Invention

This invention relates, in general, to novel and improved nickel base single crystal alloys and, in particular, to such alloys having the combined properties of improved oxidation/corrosion resistance and high strength at elevated temperatures. More specifically, the present invention relates to novel and improved nickel base single crystal alloys which retain their high temperature mechanical properties after prolonged or repeated exposure to elevated temperatures, the single crystal alloys being capable of being cast into desired shapes, such as turbine blades, vanes and other parts used in high temperature gas turbine engines, and to improved nickel base single crystal alloys which exhibit improved hot corrosion resistance. Even more specifically, the present invention relates to the above type of improved and novel nickel base single crystal alloys which can be heat treated to improve stress-rupture life of such alloys coated with conventional coatings with an accompanying heat treatment to impart high temperature oxidation/sulfidation resistance thereto without the formation of deleterious phases at the alloy/coating substrate interface.

2. Description of the Prior Art

Nickel base superalloys which have been commonly used over the years to fabricate gas turbine engine components typically contain, aside from certain levels of chromium, cobalt, aluminum, titanium and refractory metals (e.g., tungsten, molybdenum, tantalum and columbium) other elements which act as grain boundary strengtheners, such as carbon, boron and zirconium. These types of gas turbine blades are most commonly formed by casting, and the process most often utilized produces parts having equiaxed non-oriented grains. Since the high temperature properties of metals are generally dependent upon grain boundary properties, efforts have been made to strengthen the boundaries of these alloys by addition of carbon, boron and/or zirconium, as discussed above, or to reduce or eliminate the grain boundaries transverse to the major stress axis of the part. One method of eliminating such transverse boundaries is directional solidification as described in U.S. Pat. No. 3,260,505. The effect of directional solidification is to produce an oriented microstructure of columnar grains whose major axis is parallel to the stress axis of the part and which has minimal or no grain boundaries perpendicular to the stress axis of the part.

A further extension of this concept is the utilization of single crystal parts in gas turbine blades as, for example, described in U.S. Pat. No. 3,494,709. The obvious advantage of the single crystal blade is the complete absence of grain boundaries and therefore the absence of these potential weak areas of a metallic structure. Thus, the mechanical properties of the single crystal are completely dependent upon the inherent mechanical properties of the material. While single crystal nickel base alloys are generally known, there exists a need for such alloys having a varied combination of properties including improved mechanical strength, especially over prolonged and/or repeated exposure to elevated temperatures, improved oxidation/corrosion resistance (especially at elevated temperatures) and the ability to be cast to desired shapes, such as turbine blades and parts.

There exists in the patent literature many examples of nickel base superalloys and nickel base single crystal superalloys, methods for their fabrication and methods for their heat treatment. Examples of some of these prior art patents and the basic technology that they describe, is as follows:

In commonly assigned and copending U.S. Ser. No. 678,802, filed Dec. 6, 1984 for "High Strength Nickel Base Single Crystal Alloy" there, now U.S. Pat. No. 4,677,035 is described nickel base single crystal alloys which are improved, with regard to their strength and corrosion properties at elevated temperatures, by the addition of certain elements in certain amounts.

Schweizer et al., U.S. Pat. No, 4,222,794, discloses a nickel base single crystal superalloy for use at elevated temperatures having a restricted composition consisting of 4.5–6.0% chromium, 5.0–5.8% aluminum, 0.8–1.5% titanium, 1.7–2.3% molybdenum, 4.0–6.0% tungsten, 5.5–8.0% tantalum, 1.0–5.0% rhenium, 0.2–0.6% vanadium, 0–7.0% cobalt and the balance nickel. This patent also discloses a method of heat treating the alloys described therein at a specific temperature range. Although the Schweizer et al. patent discloses a single crystal alloy, said alloy differs chemically from the alloy of the present invention. For example, the alloy of the present invention is significantly higher in chromium content, titanium content and titanium to aluminum ratio. and does not contain rhenium and vanadium.

Gell et al., U.S. Pat. No. 4,116,723, discloses single crystal nickel base super alloys free from intentional additions of cobalt, boron, and zirconium. Gell at al. discusses the avoidance of the development in the single crystal alloys of deleterious phases after long term exposure at elevated temperatures (i.e., alloy instability), the phases being of two general types, sigma and mu. Sigma is undesirable because of its brittle nature while mu is undesirable because the phase ties up large amounts of the refractory solid solution strengtheners thus weakening the remaining alloy phases. The sigma and mu phases are termed TCP phases for topologically closed packed phases and one of their common properties is that they all contain cobalt. Gell et al. eliminates cobalt in the claimed single crystal nickel base alloys to inhibit the formation of TCP phases therein. Unexpectedly, the presence of cobalt in the single nickel base alloys of the present invention does not induce the formation of TCP phases. Also, the ratio of titanium to aluminum disclosed by Gell et al. is lower than that in the alloy of the present invention. While U.S. Pat. No. 4,116,723 relates to heat treatment of single crystal alloys, precipitation-hardened alloys having the high temperature mechanical properties of the instant invention (e.g., retention of high temperature properties after prolonged or repeated exposure to elevated temperature) are not obtained.

Shaw, U.S. Pat. No. 4,207,098 discloses a relatively low-strength nickel base polycrystalline alloy consisting essentially of 14–22% chromium, 5–25% cobalt, 1–5% tungsten, 0.5–3% tantalum, 2–5% titanium, 1–4.5% aluminum (with the sum of titanium plus aluminum being 4.5–9%), 0–2% niobium, 0.31–1.2% boron, 0–3.55% molybdenum, 0–0.5% zirconium, 0–0.2% in total yttrium or lanthanum or both, 0–0.1% carbon, and the balance nickel. The Shaw polycrystalline alloy, which must contain boron, is chemically different from the single crystal alloy of the present invention.

Gosh, U.S. Pat. No. 4,126,495, discloses a low strength nickel base polycrystalline alloy consisting essentially of 6.75–10.0% aluminum, 8.0–12.0% chromium, 0.8–2.5% titanium, 2.0–6.0% cobalt, 2.5–4.0% molybdenum, 0.95–4.85% tantalum, 0–1.25% tungsten, 0–0.6% columbium, 0–1.0% carbon, 0–1.0% boron, 0–0.8% zirconium, 0–1.0% rare earths, 0–1.0% beryllium and the balance nickel. The Gosh polycrystalline alloy contains lower amounts of tungsten and higher amounts of molybdenum than the single crystal alloy of the present invention.

Thielemann, U.S. Pat. No. 2,948,606, discloses a low-strength nickel-chromium-cobalt base polycrystalline alloy composed of about 15.0–25.0% chromium, 5.0–30.0% cobalt, 0.5–4.0% titanium, 2.0–5.0% aluminum, 1.0–5.0% columbium or tantalum or mixtures thereof, 5.0–11.0% tungsten and the balance essentially nickel. The Thielemann polycrystalline alloy which contains significantly higher amounts of chromium, a lower combined titanium-aluminum content and no molybdenum is chemically different from the single crystal alloy of the present invention.

Dalai et al., U.S. Pat. No. 3,807,993, discloses a polycrystalline material with a significantly higher cobalt content than the single crystal alloy of the present invention and, further, containing grain boundary strengtheners such as carbon, boron, zirconium and hafnium.

Two Restall et al. patents, U.S. Pat. Nos. 3,902,900 and 3,922,168 disclose an intermetallic compound material containing a first group including nickel and at least one of the elements chromium, cobalt, molybdenum and tungsten within the range of 72–83 atomic percent, and a second group containing aluminum (12–26 atomic percent) in combination with at least one of the elements titanium, niobium, and tantalum within the range of 17–28 atomic percent.

U.S. Pat. Nos. 4,249,943; 4,043,841; 3,785,809; 3,615,376; and 3,486,887 disclose alloys containing nickel, cobalt, chromium and aluminum together with one or more of the following elements: manganese, silicon, carbon, niobium, boron, zirconium, among others.

U.S. Pat. Nos. 2,971,838; 3,276,866; 3,926,586; 3,973,952; and 4,268,308 disclose a variety of compositions containing nickel, chromium and aluminum with one or more of the following elements: zirconium, carbon, columbium, boron and silicon, among others.

U.S. Pat. Nos. 3,257,178, Re. 29,547; 4,108,647; 4,219,592; 4,245,698; 4,288,247; 4,339,509; 4,346,137; 4,400,209; 4,400,210; 4,400,211, 4,400,349; 4,421,571 and 4,615,864 disclose alloys containing nickel, chromium and cobalt together with one or more of the following elements: molybdenum, tungsten, titanium, hafnium, yttrium, lanthanum, manganese and silicon, amongst others.

U.S. Pat. Nos. 4,219,592 and 3,257,178 disclose ranges of element additions to nickel base alloys which not only differ chemically from the alloys of the present invention, but also they fail to disclose any recognition of or even suggestion of the critical ranges of this invention.

U.S. Pat. Nos. 4,198,442 and 4,227,925 disclose alloys containing nickel together with yttrium, hafnium, and rare earth elements.

U.S. Pat. No. 4,374,084 discloses corrosion resistant alloy compositions containing manganese and silicon and U.S. Pat. No. 4,569,824 discloses a nickel base superalloy containing manganese.

Still other patents in the nickel base superalloy area include U.S. Pat. Nos. 2,621,122; 2,781,264; 2,912,322; 2,994,605; 3,046,108; 3,116,412; 3,188,204; 3,287,110; 3,304,176; and 3,322,534.

SUMMARY OF THE INVENTION

It is therefore, an object of the present invention to provide novel and improved alloy compositions which are devoid of the above-noted disadvantages, especially novel and improved single crystal nickel base alloy compositions.

It is another object of this invention to provide single crystal nickel base alloy compositions which retain their high strength and exhibit long term phase stability after prolonged and/or repeated exposure to elevated temperatures.

It is another object of this invention to provide novel and improved single crystal nickel base alloy compositions which in addition to their high strength at elevated temperatures also exhibit improved oxidation/corrosion resistance at elevated temperatures.

It is another object of this invention to provide novel heat treatment for novel and improved single crystal nickel base alloy compositions to provide improved strength to the alloy compositions.

It is a further object of this invention to provide novel and improved heat-treated, coated alloy compositions with enhanced mechanical properties.

It is still another object of this invention to provide single crystal alloy compositions which are compatible with conventional high temperature coatings, such as diffused aluminides, and do not exhibit deleterious TCP phases at the coating/single crystal alloy interface.

It is yet a further object of this invention to provide novel and improved high strength, single crystal nickel base alloys which may be cast to desired shapes, such as turbine blades, and other parts that can be used in high temperature gas turbine engines.

It is yet another objective of this invention to provide novel and improved nickel base single crystal alloy compositions having exceptional coated oxidation and sulfidation resistance including hot corrosion resistance and high strength at elevated temperatures.

It is yet a further object of this invention to provide novel and improved high strength single crystal alloys which may be cast to desired shapes (for example turbine blades, vanes or other parts) and can be used as coated or uncoated parts in high temperature gas turbines.

The foregoing objects, and others, are accomplished in accordance with this invention, generally speaking, by providing novel nickel base single crystal alloy composition consisting essentially of, by weight, about 8.0% to about 14.0% chromium; about 1.5% to about 6.0% cobalt; about 0.5% to about 2.0% molybdenum; about 3.0% to about 10.0% tungsten; about 2.5–7.0% titanium; about 2.5% to about 7.0% aluminum; about 3.0% to about 6.0% tantalum; about 0.005% to about 1.0% each of hafnium and/or silicon; and the balance nickel.

In accordance with the features of another embodiment of the present invention improved hot corrosion can also be achieved by adding to the compositions described above other minor but critical amounts of trace elements of yttrium, lanthanum and manganese either singly or in combination.

In accordance with still another embodiment of the present invention the strength (i.e., stress-rupture life) of the single crystal alloys compositions described above is improved by a novel heat treatment which comprises the steps of (i) providing a nickel base alloy composition as described above; (ii) melting and directionally solidifying the composition to produce a single crystal alloy; (iii) solution heat treating the alloy at a temperature of between about 2330° F. and about 2350° F. for about 2 to about 6 hours; (iv) rapidly cooling the alloy at a rate greater than about 120° F. per minute from the solution temperature to about 1600° F.; and (v) subjecting the alloy to a double aging heat treatment by (a) heat treating the alloy at a temperature of between about 1975° F. and 2050° F. and holding the alloy within this temperature range for about 2 to about 6 hours and then (b) heat treating the alloy at a temperature of about 1600° F. to about 1800° F. and holding the alloy within this temperature range for about 16 to about 22 hours.

The novel nickel base single crystal alloy compositions of the present invention can be coated with conventional coatings such as MCrAlY overlay coatings and aluminide coatings with an accompanying heat treatment to impart further high temperature oxidation/sulfidation resistance to the alloy compositions without the formation of deleterious TCP phases at the single crystal alloy/coating interface.

BRIEF DESCRIPTION OF THE DRAWINGS

FIG. 2 is a photograph that illustrates the visual appearance of various nickel base single crystal alloy compositions after 720 cycles of cyclic burners rig testing.

DETAILED DESCRIPTION OF THE INVENTION

Figure 1:
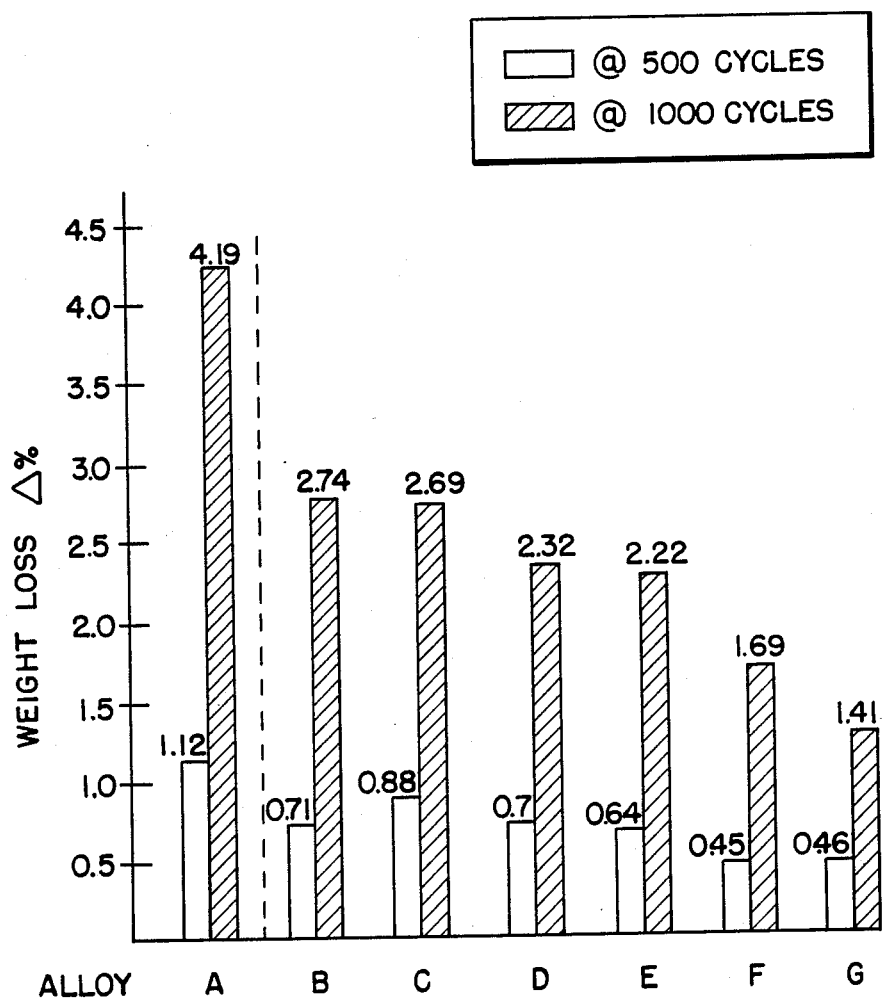
FIG. 1 is a graph illustrating the oxidation/corrosion resistance performance of certain nickel base single crystal alloy compositions in accordance with the present invention.

Unless otherwise stated, all percent figures stated herein are percent by weight.

According to the present invention, novel and improved nickel base single crystal alloy compositions having both high strength at elevated temperatures (including when there is prolonged or repeated exposure to such elevated temperatures) and significant improvement in hot corrosion resistance (improved oxidation/sulfidation resistance at elevated temperatures) are provided which consist essentially of about 8.0% to about 14.0% chromium; about 1.5% to about 6.0% cobalt; about 0.5% to about 2.0% molybdenum; about 3.0% to about 10.0% tungsten; about 2.5% to about 7.0% titanium; about 2.5% to about 7.0% aluminum; about 3.0% to about 6.0% tantalum; about 0.005% to about 1.0% each of hafnium and/or silicon; and the balance nickel.

Examples of some preferred compositions of the present invention consist essentially of about 9.0% to about 12.0% chromium; about 2.5% to about 5.0% cobalt; about 0.8% to about 1.5% molybdenum; about 4.0% to about 8.0% tungsten; about 2.5% to about 5.0% titanium; about 2.0% to about 6.0% aluminum; about 4.0% to about 5.0% tantalum; about 0.01% to about 0.5% hafnium; about 0.01% to about 0.5% silicon; and the balance nickel.

In another embodiment according to the present invention, novel and improved nickel base single crystal alloy compositions having both high strength at elevated temperatures (including when there is prolonged or repeated exposure to such temperatures) and further improved hot corrosion resistance (improved oxidation/sulfidation resistance at elevated temperatures) are provided which consist essentially of any of the alloy compositions described above to which is added minor/trace elements of yttrium, lanthanum and manganese either singly or in combination in amounts of about 0.005% to about 1.0% yttrium, about 0.005% to about 1.0% lanthanum and about 0.005% to about 1.5% manganese, and preferably in amounts of about 0.01% to about 0.5% yttrium, about 0.01% to about 0.5% manganese and about 0.01% to about 0.2% lanthanum.

In still another embodiment according to the present invention, novel and improved nickel base single crystal alloy compositions having both high strength at elevated temperatures (including where there is prolonged or repeated exposure to such temperatures) and further improved hot corrosion resistance (improved oxidation/sulfidation resistance at elevated temperatures) are provided which consist essentially of about 8.0% to about 14.0% chromium; about 1.5% to about 6.0% cobalt; about 0.5% to about 2.0% molybdenum; about 3.0% to about 10.0% tungsten; about 2.5% to about 7.0% titanium; about 2.5% to about 7.0% aluminum; about 3.0% to about 6.0% tantalum; about 0.005% to a total of about 2.0% of hafnium and/or silicon, and from about 0.005% each of one or more elements selected from yttrium, lanthanum and manganese; and the balance nickel.

Examples of some additional preferred compositions of the present invention are compositions which consist essentially of about 9.0% to about 12.0% chromium; about 2.5% to about 5.0% cobalt; about 0.8% to about 1.5% molybdenum; about 4.0% to about 8.0% tungsten; about 2.5% to about 5.0% titanium; about 3.0% to about 6.0% aluminum; about 4.0% to about 5.0% tantalum; from about 0.005% to a total of about 2.0% of hafnium and/or silicon, and from about 0.005% each of one or more elements selected from yttrium, lanthanum, and manganese; and the balance nickel.

To improve the oxidation and corrosion resistance of alloy compositions in accordance with the present invention, we will improve oxide scale integrity and stability. The unique approach to improve the stability of the oxide formed at high temperatures in accordance with the present invention involves minor additions of Hf, Si and rare earth elements, either singly or in combination. Additions will typically be on the order of up to about 2.0%. In this approach it is necessary to avoid the formation of excessive quantities of low melting compounds and thus not adversely affect the solutioning temperature or the strength levels of the base line alloy.

The compositions of the present invention are produced in single crystal form by known casting techniques (melting and directionally solidifying to produce a single crystal material). Thereafter the single crystal alloy compositions are typically heat treated by solution heat treating the single crystal alloy material at a temperature of between about 2330° F. and about 2350° F. for about 2 to about 6 hours. It is preferred to solution heat treat for about 3 hours in a vacuum atmosphere. In accordance with a further embodiment of the invention as described herein, the compositions may be subject to either a single or multiple solution heat treatment. A preferred double step solution heat treatment comprises the steps wherein the material is (i) subject to a solution heat treatment at a temperature of about 2330° F. for about 3 hours, (ii) rapidly cooled, and (iii) subject to a second solution heat treatment at a temperature of about 2350° F. for about 3 hours. After solution heat treating, the material is rapidly cooled, preferably at a rate greater than about 120° F. per minute from the solution heat treating temperature to a temperature of about 1600° F. The rapid cooling is preferably accomplished by a means such as a gas fan quench within the furnace. Typically, a gas fan quenching means is used which introduces a large volume of a neutral gas, such as for example helium, argon, etc., to lower the furnace temperature rapidly with fans aiding the circulation of the gas to attain rapid cooling. Generally speaking, the faster cooling rates help to attain better properties. Typically, the preferred cooling rates in accordance with the present invention are greater than 120° F./minute from the solution heat treating temperature to a temperature of about 1600° F. The nickel base single crystal alloys are given a solutioning heat treatment to homogenize the constitutive elements for higher strength properties, and then aged or double aged in order to provide the maximum amount of ordered precipitate phase for superior strength. In accordance with the preferred features of the present invention the material after rapid cooling would be subject to an aging treatment, preferably a double aging treatment by (i) heat treating the material at a temperature of between about 1975° F. and 2050° F. and holding the material at this temperature for about 2 to 6 hours, and then (ii) heat treating the material at a temperature of about 1600° F. to about 1800° F. and holding the material at this temperature for about 16 to about 22 hours. It is also preferred that the first aging heat treatment is performed at a temperature of about 1975° F. and held at this temperature for about 4 hours and more preferably in an atmosphere such as argon. The second aging process is preferably performed at a temperature of about 1600° F. for about 20 hours and more preferably in an atmosphere such as argon or air.

By practicing the heat treatment cycle just described, very fine (less than 1 m size) gamma rime particles can be formed in the gamma matrix thereby improving the creep resistance of the alloy.

The single crystal nickel base alloy compositions of the present invention while possessing both improved high strength at prolonged or repeated exposure to high temperatures and improved corrosion resistance at elevated temperatures, can further improve their resistance to susceptibility to the accelerated corrosive effect of the hot gas environment in which components fabricated from the alloys described herein are exposed to when used in gas turbines. To accomplish this additional improvement and further prevent unacceptably rapid oxidation and corrosion rates, protective coatings of the type normally employed in the gas turbine industry can be applied to single crystal nickel base alloy substrates of the present invention without the formation of deleterious TCP phases at the coating/substrate interface. Diffused aluminide coatings and MCrAlY overlay coatings are examples of coating materials which can be successfully employed as protective coatings for the single crystal nickel base alloy of the present invention.

Aluminide coatings are produced by diffusion of aluminum into the single crystal nickel base alloy substrate and the reaction of aluminum with the alloy to produce intermetallic compounds. In high temperature use, the surface of the alloy substrate develops an alumina layer which acts as a barrier to further oxidation of the coated component. MCrAlY coatings are themselves oxidation resistant and do not depend upon any reaction with or diffusion into a substrate. In MCrAlY coatings in use today, M represents primarily nickel or cobalt alone or mixtures of nickel or cobalt with up to about 9 percent molybdenum, and preferably about 1 to 3 percent molybdenum wherein the metal or metals represented by M comprise about 30 to 75 percent by weight of the coating, chromium comprises about 10 to about 40 percent by weight of the coating, aluminum comprises about 5 to about 20 percent by weight of the coating and yttrium comprises about 0.1 to about 1.0 percent by weight of the coating. Optionally small amounts, e.g., about 0.1 to about 10 percent by weight of a metal selected from Hf, Si, Mn, Pt and mixtures thereof may also be incorporated in the MCrAlY coating.

The aluminide coating may be conveniently deposited on the single crystal nickel base alloy substrate by a pack method. In this method, the substrate to be coated is thoroughly cleaned to remove foreign debris from the substrate which is then packed in a powdered NiAl alloy containing about 22 to about 40% by weight aluminum. The pack is heated in a vacuum furnace with the pack held at about 1900 to about 2050° F. for between about 2 to about 8 hours whereby a coating thickness of between about 40 to about 120 m is developed on the substrate surface.

The MCrAlY overlay coating is applied to the single crystal nickel base alloy substrate at a thickness varying from about 40 to about 200 m and preferably about 70 to about 120 m. Among the other methods by which the MCrAlY overlay coating may be applied to the substrate include conventional physical vapor deposition processes as, for example, low pressure plasma spray (LPPS) or sputtering. A diffusion cycle of about 1900° to 2050° F. for 2 to 4 hours is used after application of the coating.

Vapor phase aluminide coatings are similar in composition to the pack aluminides. However, the process is slightly different. Whereas in the pack aluminides the parts are embedded in the pack mixture, in the vapor phase the packs are placed or suspended above the pack mixture and additional carrier flow gases, e.g., argon, are added to pass through the pack material to carry the aluminum halide gas towards the heated component to react with it and form NiAl (which is the pack or vapor aluminide coating composition). An advantage of the vapor phase coating is that it can be deposited at the aging cycle of the method described herein, i.e., 1975° F. It is therefore possible in accordance with the invention described herein to combine the coating cycle with the heat treatment cycle.

Sputtering is a coating process wherein the particles are liberated from a target surface composed of the MCrAlY alloy by bombardment of energetic ions and then accelerated towards the single crystal nickel base alloy substrate under the influence of an applied high voltage in a gas at $10^{-1}$ Torr or less to deposit the required coating. It is preferred, that the MCrAlY coating be applied to the nickel base single crystal alloy substrate of the present invention by means of a LPPS process.

In a LPPS process, controlled amounts of the coating powder alloy are introduced in the plasma stream of the spray gun. The powder becomes molten and is projected at a very high velocity on the preheated (in the order of about 1,750° F.) surface of the part to be coated which is contained within a vacuum chamber under pressure of about 10⁻⁴ Torr or greater. Upon impact against the surface to be coated, the coating alloy particles transfer thermal and mechanical energy to the substrate, producing forces which favor fusing and bonding, thus producing a dense and adherent coating. Deposition time is controlled to obtain a coating thickness of between about 0.070 to about 120 m and an acceptable density of 98%. Specimens are glass bead peened at 6-7 N intensity and diffusion heat treated at 1,065° C. for about 4 hours.

The temperatures generally employed to diffuse aluminide and MCrAlY coatings, e.g., 1900°-2050° F. do not deleteriously effect the physical properties of the nickel base single crystal alloys of the present invention which are subjected to such coating processes, such temperatures having been found to be compatible with the aging kinetics of the alloy substrate.

The present invention may be better understood through reference to the following example which is meant to be illustrative of some of the embodiments of the present invention.

EXAMPLE 1

A series of single crystal nickel base alloy compositions (hereinafter identified as alloys (A–G as shown in Table I) were cast by differential solidification and cooled to room temperature. Alloy A is an example of a single crystal nickel base alloy not having the specific improvements in accordance with the present invention. Alloys B to G are various examples of the single crystal alloys that incorporate embodiments of the present invention.

TABLE I*

| Alloy | Cr | Ti | Mo | Al | Co | W | Ta | Hf | Si | Ni |
|---|---|---|---|---|---|---|---|---|---|---|
| A | 10.1 | 3.18 | 0.92 | 4.4 | 2.52 | 6.5 | 4.42 | — | — | Bal. |
| B | 10.6 | 3.18 | 0.92 | 4.4 | 2.52 | 6.5 | 4.42 | 0.2 | — | Bal. |
| C | 10.6 | 3.18 | 0.92 | 4.4 | 2.52 | 6.5 | 4.42 | 0.4 | — | Bal. |
| D | 10.6 | 3.68 | 0.92 | 4.15 | 2.52 | 6.5 | 4.42 | 0.3 | — | Bal. |
| E | 10.6 | 3.68 | 0.92 | 4.15 | 5.0 | 6.5 | 4.42 | 0.3 | — | Bal. |
| F | 10.6 | 3.68 | 0.92 | 4.15 | 5.0 | 6.5 | 4.42 | — | 0.15 | Bal. |
| G | 10.6 | 3.68 | 0.92 | 4.15 | 5.0 | 6.5 | 4.42 | 0.2 | 0.10 | Bal. |

*FIGS. in this Table are all percent by weight.

Alloys A–G were subject to a solutioning heat treatment as shown in Table II to homogenize the constitutive elements for subsequent higher strength after aging. The solution heat treatments for Alloys B–G were conducted by heating the alloys between 2330° F.-2350° F. for 3 hours in a vacuum atmosphere and then rapidly cooling the alloys by a gas fan quench within the furnace using a neutral gas. The alloys were cooled at a rate greater than 120° F./min from the solutioning temperature to about 1600° F. Table II illustrates nominal solutioning temperatures that can be used for Alloys B-G.

TABLE II

| Alloy | Solution Heat Treatment Temperature (°F.) | Time at Solution Temperature (hours) |
|---|---|---|
| B | 2350 | 3 |
| C | 2340 | 3 |
| D | 2340 | 3 |
| E | 2340 | 3 |
| F | 2330 | 3 |

TABLE II-continued

| Alloy | Solution Heat Treatment Temperature (°F.) | Time at Solution Temperature (hours) |
|---|---|---|
| G | 2330 | 3 |

To illustrate different features of the present invention, three different heat treatments are given. In each heat treatment the solution treatment is fixed for an alloy based on its temperature capabilities. Heat treatment (1) comprises solutioning at 2350° F. for 3 hours in a vacuum atmosphere followed by rapid cooling at a rate greater than 120° F./min. to 1600° F. by a gas fan quench, subjecting the alloy to a first aging heat treatment at 1975° F. for 4 hours in an argon atmosphere and then subjecting the alloy to a second aging heat treatment at 1600° F. for 20 hours in an argon or air atmosphere. Heat treatment (2) is the same as heat treatment (1) except the solution heat treatment temperature for (2) is 2330° F. Heat treatment (3) illustrates a method for further improving stress-rupture properties by solutioning the alloy two times prior to aging. Heat treatment (3) comprises the steps of (i) solutioning the alloy at 2330° F. for 3 hours in a vacuum atmosphere followed by rapid cooling at a rate greater than 120° F./min. to 1600° F. by a gas fan quench, (ii) solutioning the alloy at 2350° F. for 3 hours in a vacuum atmosphere followed by rapid cooling at a rate greater than 120° F./min to 1600° F. by a gas fan quench, (iii) subjecting the alloy to a first aging heat treatment at 1975° F. for 4 hours in an argon atmosphere, and then (iv) subjecting the alloy to a second aging heat treatment at 1600° F. for 20 hours in an argon or air atmosphere.

Table III illustrates typical strength (stress-rupture life) properties of selected alloys which have been subject to heat treatments (1), (2) or (3). It is apparent from Table III that the method used for heat treatment as, for example, heat treatment (3) further improves the stress-rupture life. It was also observed that microstructures with up to 5% by volume of incipient melting give improved stress-rupture life. For example, alloy G heat treated with heat treatment (2) exhibited no incipient melting while alloy G heat treated at the higher solutioning temperature of 2350° F. by heat treatment (1) exhibited 5% by volume incipient melting. The increase in strength values for both examples is attributed to effective homogenization of the alloy composition during heat treatment. It was also observed that the double solution heat treatment of an alloy followed by aging or the single solution heat treatment which induces up to 5% by volume incipient melting (i.e., oversolutioned) in an alloy followed by aging, even further improves the strength values than alloys that are undersolutioned during heat treatment.

TABLE III

| Alloy | Heat Treatment | Test Temp °F. | Test Stress ksi | Life Hrs | Elong % |
|---|---|---|---|---|---|
| A | 1 | 1800 | 32 | 224.8 | 14.0 |
| A | 1 | 1600 | 65 | 240.5 | 10.7 |
| A | 1 | 1400 | 110 | 368.0 | 10.0 |
| A | 3 | 1800 | 32 | 244.9 | 12.3 |
| A | 3 | 1600 | 65 | 401.6 | 12.2 |
| A | 3 | 1400 | 110 | 606.6 | 11.3 |
| B | 1 | 1800 | 32 | 288.1 | 13.0 |
| B | 1 | 1600 | 65 | 546.5 | 12.3 |
| B | 3 | 1800 | 32 | 466.2 | 11.9 |

Stress Rupture Data With Variations in heat Treatment

TABLE III-continued

Stress Rupture Data With Variations in heat Treatment

| Alloy | Heat Treatment | Test Temp °F. | Test Stress ksi | Life Hrs | Elong % |
|---|---|---|---|---|---|
| B | 3 | 1600 | 65 | 406.8 | 13.0 |
| F | 2* | 1800 | 32 | 173.5 | 12.2 |
| F | 2* | 1600 | 65 | 339.8 | 11.4 |
| F | 2* | 1400 | 110 | 697.6 | 4.0 |
| F | 1** | 1800 | 32 | 304.6 | 12.0 |
| F | 1** | 1600 | 65 | 277.1 | 10.6 |
| F | 1** | 1400 | 110 | 697.6 | 4.0 |
| G | 2* | 1800 | 32 | 114.5 | 15.1 |
| G | 2* | 1600 | 65 | 89.2 | 16.4 |
| G | 2* | 1400 | 110 | 256.2 | 8.7 |
| G | 1** | 1800 | 32 | 276.7 | 7.5 |
| G | 1** | 1600 | 65 | 502.3 | 12.5 |
| G | 1** | 1400 | 110 | 528.5 | 4.3 |

Heat Treat:
1 2350° F./3 hrs/RAC + 1975° F./4 hrs + 1600° F./20 hrs
2 2330/3/RAC + 1975/4 + 1600/20
3 2330/3/RAC + 2350/3/RAC + 1975/4 + 1600/20
*Denotes Undersolutioning Microstruture
**Denotes Low Incipient Melt Microstructures
RAC— Cooling at a rate greater than 120° F./min. to 1600° F.

The data in Table III also indicates that the single crystal alloys in accordance with the present invention that contain minor amounts of hafnium and/or silicon as compared to these single crystal alloys without hafnium or silicon have retained strength levels while exhibiting significant improvement in oxidation (corrosion) resistance. Therefore, the addition of certain preferred minor amounts of elements such as hafnium and/or silicon to Alloy A does not degrade stress-rupture life while significantly improving (by greater than two times) oxidation/corrosion resistance.

Oxidation/Corrosion Testing

Testing was conducted which indicated that Alloys B-G have improved in oxidation/corrosion resistance as compared to Alloy A.

Cyclic burner rig tests were conducted to evaluate the oxidation/corrosion performance of Alloys B-G. Alloy A was included in the test for reference. The burner rig test consisted of mounting the bare test (0.5 inch nominal diameter) specimens onto a rotating shaft which cycled from the hot zone to the cool zone. The burner rig utilized a fuel with 0.2% sulfur and 6 ppm salt which was injected separately onto the specimens while in the hot zone. The six-minute test cycle utilized a two-temperature set point (1650° F., 2 min./1950° F., 2 min./water cool). The specimens were removed from the holder after every 10 hours of testing to examine the extent of degradation through visual, depth of attack and weight gain/loss measurements.

FIG. 1 summarizes the performance in oxidation/corrosion resistance of the improved single crystal alloys (Alloys B-G) against the baseline single crystal alloy (Alloy A) after 500 and 1000 cycles of the rig test. Generally speaking, the improved alloys in accordance with one embodiment of the present invention (Alloys B-G) exhibited a two - three times improvement in oxidation/corrosion resistance over Alloy A (without the hafnium and/or silicon). While all compositions (Alloys (B-G) in accordance with the present invention exhibited improved oxidation/corrosion resistance based on weight loss over Alloy A, two of the alloys (Alloy F and G) exhibited significant improvement in performance as illustrated in FIG. 1. Alloy G, for example, exhibited only a 1.41 % weight loss when compared with 4.19 % weight loss for Alloy A after 1000 cycles of burner rig test.

Comparing the overall performance (FIG. 1) with the composition variation (Table 1) it is observed that the addition of minor amounts of hafnium and/or silicon to the nickel single crystal compositions greatly improves oxidation/corrosion resistance. It is also observed that minor silicon additions (Alloy F) have a major beneficial influence in oxidation/corrosion resistance when compared with hafnium additions (Alloys B-E). However, silicon and hafnium additions (Alloy G) exhibited superior properties in improving oxidation/corrosion resistance.

Figure 2:
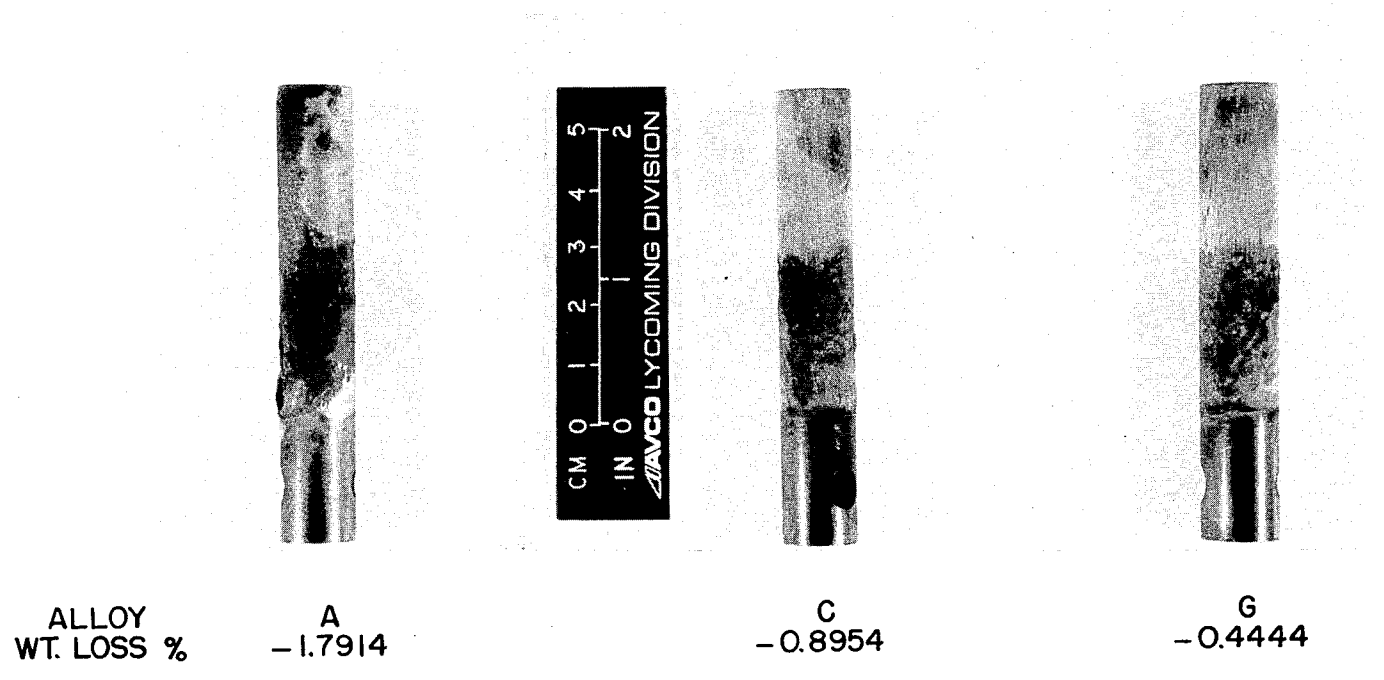

FIG. 2 illustrates the visual appearance of Alloys A, C and G after 720 cycles of the rig test. Note the degradation on Alloy A and its weight loss when compared with the improved performance when minor amounts of hafnium or hafnium and silicon are used (Alloys C and G).

Table IV lists the average depth of the oxidation/corrosion attack based material loss at two highly distressed regions of the test specimens. It is evident from Table IV that single crystal alloy G has three times the improvement in hot corrosion resistance (reduced depth of attack) over the base single crystal Alloy A while exhibiting equivalent behavior of nickle alloys which have excellent oxidation/corrosion resistance amongst equiox alloys.

TABLE IV

| Alloy | Average Depth Of Attack After 450 Cycles Of Oxidation/Corrosion Testing Average Depth Of Attack (mils) |
|---|---|
| Alloy A | 5.50 |
| Alloy G | 1.75 |

It is to be understood that the above described embodiments of the invention are illustrative only and that modifications throughout may occur to those skilled in the art. Accordingly, this invention is not to be regarded as limited to the embodiments disclosed herein, but is to be limited as defined by the appended claims.

What is claimed is:

1. A single crystal alloy composition having improved oxidation/corrosion resistance and high strength at elevated temperatures consisting essentially of, by weight, about 8.0% to about 14.0% chromium; about 1.5% to about 6.0% cobalt; about 0.5% to about 2.0% molybdenum; about 3.0% to about 10.0% tungsten; about 2.5% to about 7.0% titanium; about 2.5% to about 7.0% aluminum; about 3.0% to about 6.0% tantalum; about 0.005% to about 1% each, of at least one additive from the group consisting of hafnium and silicon; from 0 to 1% yttrium; from 0 to 1% lanthanum; from 0 to 1.5% manganese, and the balance nickel.

2. The composition of claim 1 consisting essentially of, by weight, about 9.0% to about 12.0% chromium; about 2.5% to about 5.0% cobalt; about 0.8% to about 1.5% molybdenum; about 4.0% to about 8.0% tungsten; about 2.5% to about 5.0% titanium; about 3.0% to about 6.0% aluminum; about 4.0% to about 5.0% tantalum; from about 0.005% up to about 0.5% hafnium; from about 0.005% up to about 0.5% silicon; from 0 up to about 0.5% yttrium; from 0 up to about 0.5% manganese; from 0 up to about 0.2% lanthanum; and the balance nickel.

3. The composition of claim 1 containing at least about 0.005% by weight up to the stated maximum content of at least one additive from the group consisting of yttrium, lathanum and manganese.

4. The composition of claim 3 comprising from 0 up to about 0.5% yttrium; from 0 up to about 0.5% manganese; and from 0 up to about 0.2% lanthanum.

5. The composition of claim 1 further comprising about 0.005% to about 1.0% yttrium.

6. The composition of claim 1 further comprising about 0.005% to about 1.0% lanthanum.

7. The composition of claim 1 further comprising about 0.005% to about 1.5% manganese.

8. The composition of claim 1 further comprising about 0.01% to about 0.5% yttrium.

9. The composition of claim 1 further comprising about 0.01% to about 0.2% lanthanum.

10. The composition of claim 1 further comprising about 0.01% to 0.5% manganese.

11. The composition of claim 1 wherein the total amount of yttrium, lanthanum and manganese is from 0.01% up to about 1.0%

12. A single crystal alloy composition having improved oxidation/corrosion resistance and high strength at elevated temperatures consisting essentially of, by weight, about 8.0% to about 14.0% chromium; about 1.5% to about 6.0% cobalt; about 0.5% to about 2.0% molybdenum; about 3.0% to about 10.0% tungsten; about 2.5% to about 7.0% titanium; about 2.5% to about 7.0% aluminum; about 3.0% to about 6.0% tantalum; about 0.005% to about 1% each, of at least one additive from the group consisting of hafnium and silicon; from 0 to 1% yttrium, from 0 to 1% lanthanum and from 0 to 1.5% manganese; and the balance nickel.

13. The composition of claim 12 consisting essentially of, by weight, about 9.0% to about 12.0% chromium; about 2.5% to about 5.0% cobalt; about 0.8% to about 1.5% molybdenum; about 4.0% to about 8.0% tungsten; about 2.5% to about 5.0% titanium; about 3.0% to about 6.0% aluminum; about 4.0% to about 5.0% tantalum; about 0.01% to about 1% each, of at least one additive from the group consisting of hafnium and silicon; about 0.01% up to of one or more elements selected from the group consisting of yttrium, lanthanum and manganese; and the balance nickel.

14. The composition of claim 12 containing from 0.005% up to 0.5% hafnium.

15. The composition of claim 12 containing from 0.005% up to 0.5% silicon.

16. An article of manufacture comprising a substrate material fabricated from the composition of claim 1, the substrate being coated with a layer of an aluminide deposit to impart improved high temperature oxidation/corrosion resistance thereto.

17. The article of claim 16 wherein the aluminide deposit is prepared from a NiAl alloy which contains from about 25 to about 40 percent by weight aluminum, the balance being nickel.

18. An article of manufacture comprising a substrate material fabricated from the composition of claim 1, the substrate being coated with an overlay coating to impart improved high temperature oxidation/corrosion resistance thereto, the overlay coating composition having the general formula MCrAlY wherein M is a solid solution of metal selected from the group consisting of nickel, cobalt, and mixtures of nickel and cobalt with molybdenum wherein the metals represented by M comprise 30 to 75 percent by weight of the coating; chromium comprises about 10 to about 40 percent by weight of the coating; aluminum comprises about 5 to about 20 percent by weight of the coating and yttrium comprises about 0.1 to about 1.0 percent by weight of the coating.

* * * * *

UNITED STATES PATENT AND TRADEMARK OFFICE
CERTIFICATE OF CORRECTION

PATENT NO. : 4,885,216
DATED : December 5, 1989
INVENTOR(S) : Naik

It is certified that error appears in the above—identified patent and that said Letters Patent is hereby corrected as shown below:

Col. 14, line 6, after "to" insert --the stated maximum content--.

Signed and Sealed this

Twentieth Day of November, 1990

Attest:

HARRY F. MANBECK, JR.

Attesting Officer

Commissioner of Patents and Trademarks